United States Patent [19]
Ling et al.

[11] Patent Number: 5,763,319
[45] Date of Patent: Jun. 9, 1998

[54] PROCESS FOR FABRICATING SEMICONDUCTOR DEVICES WITH SHALLOWLY DOPED REGIONS USING DOPANT COMPOUNDS CONTAINING ELEMENTS OF HIGH SOLID SOLUBILITY

[75] Inventors: Peiching Ling, San Jose; Tien Tien, Sunnyvale, both of Calif.

[73] Assignee: Advanced Materials Engineering, Sunnyvale, Calif.

[21] Appl. No.: 656,273

[22] PCT Filed: Jan. 19, 1996

[86] PCT No.: PCT/US96/00732

§ 371 Date: Jun. 5, 1996

§ 102(e) Date: Jun. 5, 1996

[87] PCT Pub. No.: WO97/07534

PCT Pub. Date: Feb. 27, 1997

Related U.S. Application Data

[63] Continuation-in-part of Ser. No. 514,757, Aug. 15, 1995.

[51] Int. Cl.$^6$ ................................................. H01L 21/265
[52] U.S. Cl. ........................ 438/514; 438/514; 438/528
[58] Field of Search ................................. 438/514, 515, 438/518, 520, 544, 918, 306, 528; 427/523, 527

[56] References Cited

U.S. PATENT DOCUMENTS

| | | |
|---|---|---|
| 4,774,195 | 9/1988 | Benking. |
| 4,928,156 | 5/1990 | Alvis et al.. |
| 5,073,507 | 12/1991 | Keller et al.. |
| 5,126,278 | 6/1992 | Kodaira. |
| 5,254,484 | 10/1993 | Hafner et al.. |
| 5,354,696 | 10/1994 | Oostra et al.. |
| 5,453,404 | 9/1995 | Leedy. |
| 5,489,550 | 2/1996 | Moslehi. |
| 5,508,208 | 4/1996 | Sato. |

*Primary Examiner*—John Niebling
*Assistant Examiner*—S. Mulpuri
*Attorney, Agent, or Firm*—Coudert Brothers

[57] ABSTRACT

A method for manufacturing shallowly doped semiconductor devices. In the preferred embodiment, the method includes the steps of: (a) providing a substrate where the substrate material is represented by the symbol Es (element of the substrate); and (b) implanting the substrate with an ion compound represented by the symbol $El_xEd_y$, where El represents an element having high solubility in the substrate material with minimal detrimental chemical or electrical effects and can be the same element as the substrate element, Ed (dopant element) represents an element which is an electron acceptor or donor having high solubility limit in the substrate material, and x and y indicate the number of respective El and Ed atoms in the ion compound.

38 Claims, 1 Drawing Sheet

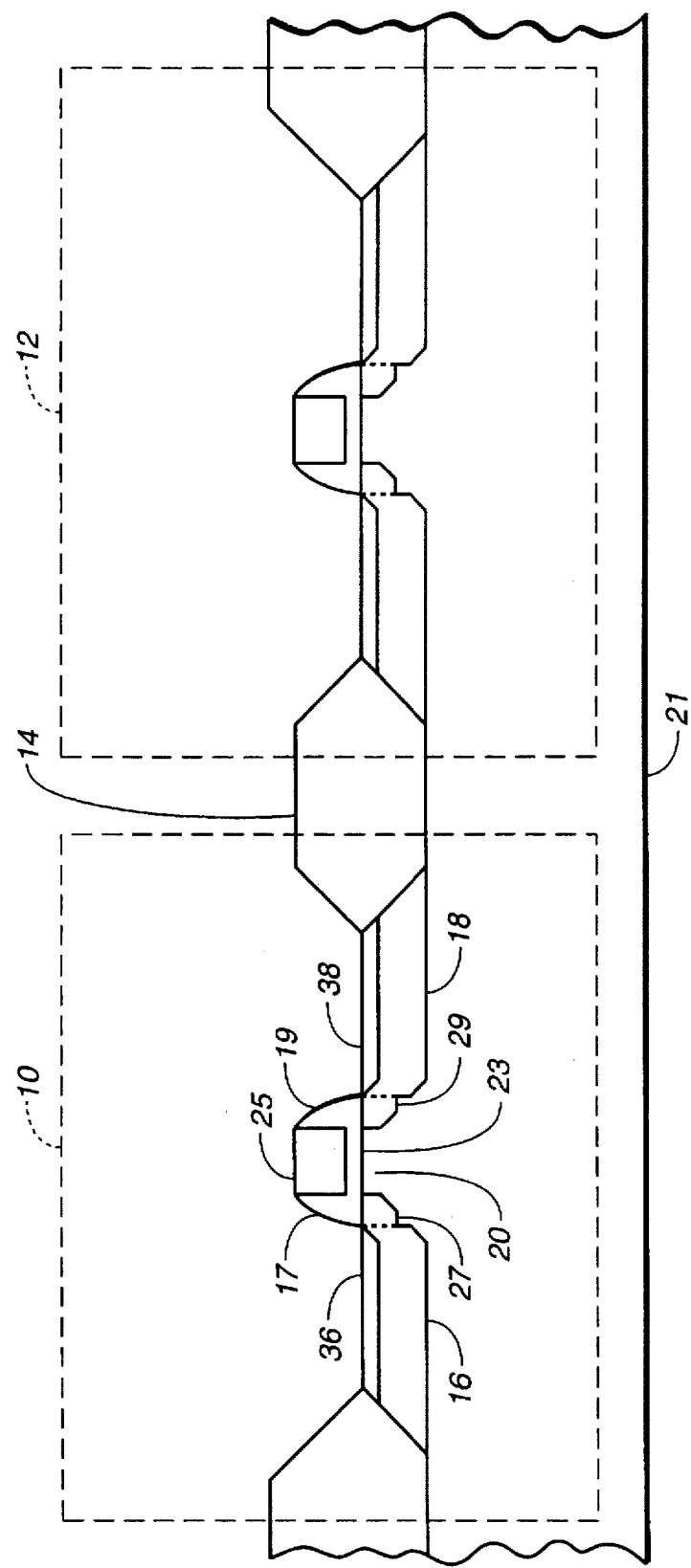
FIG._1

PROCESS FOR FABRICATING SEMICONDUCTOR DEVICES WITH SHALLOWLY DOPED REGIONS USING DOPANT COMPOUNDS CONTAINING ELEMENTS OF HIGH SOLID SOLUBILITY

CROSS REFERENCE

This application claims priority to a PCT application, PCT/US96/00732, filed on 19 Jan. 1996. The PCT application is a continuation-in-part application of a copending U.S. patent application, Ser. No. 08/514,757, filed Aug. 15, 1995, entitled "A Process for Fabricating Semiconductor Devices With Shallow P-Type Regions Using Dopant Compounds Containing Elements of High Solid Solubility."

BACKGROUND OF THE INVENTION

1. Field of the Invention

The present invention generally relates to the fabrication process of semiconductor devices, and in particular, the present invention relates to the fabrication process of semiconductor devices with very shallowly doped regions.

2. Description of the Prior Art

As the overall dimensions of semiconductor devices are miniaturized and made ever smaller, the formation of very shallowly doped regions, e.g. those less than a quarter-micron in depth, becomes a major limiting factor in the fabrication process for all miniature devices, including but not limited to metal oxide semiconductor field-effect transistors (MOSFET) and complementary metal oxide semiconductor (CMOS) devices.

The method used to make these vital CMOS and MOSFET transistors involves the formation of both n-type and p-type doped regions where n-type doped regions can be formed by the ion implantation of n-type elements in Group V A of the Periodic Table, and p-type doped regions can be formed by the ion implantation of elements in Group III A of the Periodic Table.

Technical difficulties currently hamper the formation of shallowly doped regions. In most semiconductor fabrication processes, the dopant boron is used to form p-type regions, and boron has a very low atomic number (Z=5). Traditional ion implantation techniques pose several problems in implanting low Z dopants. During the ion implantation process, a low Z dopant such as boron tends to channel through the crystalline structure of the substrate and forms a very undesirable, deep implantation profile tail where the concentration and depth of the dopant easily extends beyond the desired channel depth. This inability to control the junction depth seriously degrades device performance. Thus, it is not feasible to use conventional implantation technology to implant a low atomic dopant to form shallowly doped regions for very large scale integrated (VLSI) circuits or ultra large scale integrated (ULSI) circuits. Although there are techniques currently available to minimize the channeling effect, these techniques require additional processing steps and thus result in higher manufacturing costs. A different method for implantation of boron ions is to use low energy ion implantation techniques, but these techniques pose other problems. One problem is that it is difficult to manufacture low energy ion implantation equipment, i.e. equipment generating energy less than 5 Kev. Another problem is that using low energy ion implantation (energy less than 5 KeV) can result in sputtering or deposition where the boron ions fail to penetrate the substrate surface.

Several techniques are currently used to overcome the technical difficulties associated with ion implantation of low z dopants and low energy ion implantation. In one case, the shallow p-region is formed using a heavier ion compound, i.e. $BF_2$. Due to the higher mass of the compound, the constituent atoms of the $BF_2$ ion provide a shallower penetration depth for a given ion energy, thus enabling the formation of shallower p-type regions. The $BF_2$ ions provide another key advantage in that they reduce the channeling effect and thus the associated problems. This improvement is accomplished by the increased crystalline structural damage caused by the heavier fluorine atoms of the ion compound. Furthermore, since fluorine is neither a p-type nor an n-type dopant, the fluorine atoms that are introduced from the $BF_2$ ions do not directly contribute to the electrical performance of the semiconductor device.

However, the introduction of fluorine generates a new set of problems. Due to their low solubility in silicon, the fluorine atoms tend to migrate, particularly if the substrate is heated. After a $BF_2$ ion implantation process, any subsequent process which requires elevation of temperature will tend to cause the implanted fluorine to migrate to the silicon surface, i.e. the silicon-oxide interface. In some cases, this migration causes the fluorine to coalesce and form a gap or bubble at the interface which in turn causes contact problems such as poor contact reliability, high contact resistance, and unstable electrical performance.

For all the above reasons, $BF_2$ ion implantation is not a viable solution for the fabrication of shallowly doped regions. Therefore, there is a profound need in the art of semiconductor device fabrication, particularly for devices requiring shallowly doped regions, for a fabrication process that will resolve these difficulties and limitations.

SUMMARY OF THE INVENTION

It is therefore an object of the present invention to provide a fabrication process for forming shallowly doped regions in semiconductor devices.

It is another object of the present invention to provide a method for introducing a dopant in the fabrication of semiconductor devices where a doped region is formed having a well-defined, reproducible shallow-depth and a uniform diffusion profile.

It is still another object of the present invention to provide a method for introducing a dopant in the fabrication of semiconductor devices where the contacts to the substrate surfaces of the resultant semiconductor devices have low contact resistance.

It is still another object of the present invention to provide a method for introducing a dopant in the fabrication of semiconductor devices having shallow-depth regions and minimizing the channeling effect in the implantation process.

Briefly, the present invention provides a method for manufacturing shallowly doped semiconductor devices. In the preferred embodiment, the method includes the steps of: (a) providing a substrate where the substrate material is represented by the symbol Es (element of the substrate); and (b) implanting the substrate with an ion compound represented by the symbol $E1_xEd_y$, where E1 represents an element having high solubility in the substrate material with minimal detrimental chemical or electrical effects and can be the same element as the substrate element, Ed (dopant element) represents an element which is an electron acceptor or donor having high solubility limit in the substrate material, and x and y indicate the number of respective E1 and Ed atoms in the ion compound. For example, in implementing the method, a silicon substrate is implanted with $SiB_2$ ion compounds to create a shallowly p-doped region. In another implementation, a silicon substrate is implanted with $Ge_xEd_y$ ion compounds. In yet another implementation, a germanium substrate is implanted with $Si_xEd_y$ or $Ge_xEd_y$ ion compound.

In another embodiment, the ion compound implanted is represented by the symbol $E1_xE2_yEd_z$ where E1 and E2 represent two elements having high solubility in the substrate material with minimal detrimental chemical, electrical, or physical effects, and one of the elements can be the same element as that of the substrate material. Ed represents an element which is an electron acceptor or donor in the substrate, and x, y, and z indicate the number of respective E1, E2, and Ed atoms in the ion compound. For example, a silicon substrate is implanted with $Si_xGe_yEd_z$ ion compound.

Note that it is within the scope of the present invention disclosed herein to use ion compounds comprised of EnEd elements where En represents two or more elements in various atomic ratios and Ed represents the doping element.

The present invention can also be applied to a previously doped region to alter the doping in that region. For example, the present invention can be applied to a previously n-doped region where a p-type dopant ion compound of the present invention is implemented to change the total active dopant of the n-doped region, and vice versa.

Note that the use of the term "ion compound" in this specification refers to both positively and negatively charged ion compounds which may have one or more charges.

An advantage of the present invention is that it provides a method for introducing a dopant in the fabrication of semiconductor devices that results in shallow-depth doped regions where the fabrication process can be better controlled to produce doped regions having well-defined and reproducible shallow-depth regions with uniform diffusion profiles.

Another advantage of the present invention is that it provides a method for introducing a dopant in the fabrication of semiconductor devices where the contacts to the substrate surfaces of the resultant semiconductor devices have low contact resistance.

Another advantage of the present invention is that it provides a method for introducing a dopant in the fabrication of semiconductor devices having shallow-depth regions and minimizing the channeling effect in the implantation process.

These and other objects and advantage of the present invention will no doubt become obvious to those of ordinary skill in the art after having read the following detailed description of the preferred embodiments.

IN THE DRAWINGS

FIG. 1 is an enlarged cross-sectional view of a typical MOSFET device.

DETAILED DESCRIPTION OF THE PREFERRED EMBODIMENTS

The present invention provides a method for fabricating semiconductor devices having shallowly doped regions which is necessary for miniaturization of semiconductor devices.

FIG. 1 shows a cross-sectional view of a typical MOSFET device composed of a silicon substrate 21, with a p-type transistor 10 and an n-type transistor 12 formed thereon. Transistors 10 and 12 are isolated from each other by an oxide strip 14 which preferably is a silicon dioxide strip. For those ordinarily skilled in the art, it is well known that a great number of transistors separated by isolation oxide regions may be formed on a silicon substrate.

The description herein focuses on the p-type transistor to illustrate the novel features of the present invention, although the methods of the present invention applies to n-type transistors as well. The p-type transistor 10 includes a p-doped source region, 16 and 27, and drain region, 18 and 29, separated by a channel region 20. The source region, 16 and 27, the drain region, 18 and 29, and the channel region 20 are formed on a lightly doped silicon substrate 21. The channel region 20 is insulated by an insulating layer 23 and covered by a conductive layer (gate electrode) 25 formed on top of the insulating layer 23. The gate electrode 25 is surrounded by spacers 17 and 19 which are used as masks for the formation of the heavily doped source and drain regions. The regions directly underneath the spacers are lightly doped source and drain regions 27 and 29. Two surface layers 36 and 38 are formed on top of the source and drain regions 16 and 18 respectively to serve as contacts for electrical connection to other circuits (not shown).

The present invention teaches three general criteria in selecting the composition of an ion compound to be implanted into the substrate to create a shallowly doped region. The ion compound generally consists of the dopant and one or more complementary elements. The first criterion is that the dopant must have a sufficiently high level of solid solubility in the substrate material; the second criterion is that the ion compound must be heavy; and the third criterion is that the complementary element or elements must have high solubility in the substrate material and should not have undesirable electrical, chemical, or mechanical effects.

DOPANT HIGH SOLID SOLUBILITY

The present invention teaches a fabrication process which takes advantage of a fundamental physical phenomenon known as solid solubility. Specifically, when different types of elements, either as a single atom or as part of a compound, are introduced into a solid substrate of a selected type of material, each type of these 'alien' atoms introduced into the substrate has a solid solubility limit in the substrate, i.e. a maximum concentration of that element which the substrate can accommodate. When the concentration of these 'alien' atoms exceeds the solid solubility limit of the substrate, micro structural defects are formed. These defects then adversely affect the projected electrical properties of the doped regions of the semiconductor device which in turn adversely impact device performance and reliability.

In order to form a p-type region, a dopant is selected from Group IIIA of the Periodic table which includes boron (B), aluminum (Al), gallium (Ga), and indium (In), with boron being the preferred choice. The dopant is introduced into a substrate which can be a diamond substrate, a silicon substrate or a germanium substrate (or other Group VA elements) where silicon is the most common substrate material. To form an n-type region, a dopant is selected from Group VA of the Periodic Table which includes phosphorus (P), antimony (Sb), and arsenic (As), with phosphorus and arsenic being the preferred choices.

In selecting a dopant in accordance with the present invention, the dopant selected must have a solid solubility higher than the desired doping concentration level of the dopant in the substrate. The solid solubility of an element in any substrate can be determined by various methods. One such method is to implant the substrate with several gradually different concentration levels of that element and to look for indications such as segregation, precipitation, defect formation including voids, and second phase formation, where concentration levels begin to exceed the solid solubility limit of the substrate.

For p-type doping, boron exhibits relatively the highest solid solubility level in a silicon substrate and it is therefore the preferred choice for p-type doping. For n-type doping, arsenic and phosphorus exhibit relatively high solid solubility levels. Because high solubility levels can accommodate higher concentrations of the respective elements in the silicon substrate, these elements are the preferred choices for doping.

MASS OF THE ION COMPOUND FOR IMPLANTATION

As a dopant, the boron atom itself is a very light atom, and it is difficult to form a shallow region by using boron atoms alone as a dopant. In order to create a shallowly doped region, the weight of ions implanted into the substrate is increased by using boron compounds. For the same amount of energy, a heavier object, such as a boron compound, accelerating and traveling into the substrate will not travel as deep into the substrate as a lighter object such as a boron atom. The same principle applies to n-type doping.

The most commonly used compound for forming shallow p regions in the conventional fabrication process is the $BF_2$ compound where the fluorine atoms are added to increase the weight of the implanted ions thus reducing the depth of the doped regions. However, since fluorine has a relatively low solid solubility in the silicon substrate, as soon as the fluorine concentration exceeds its solid solubility limit in relation to the substrate material, the problems associated with micro structural defects occur. The defects caused by these alien atoms lead to problems such as segregation, precipitation, diffusion to surface, dislocation and bubbles as described above. The present invention teaches a method to select the complementary element or elements forming ion compounds which avoid the above described problems.

HIGH SOLID SOLUBILITY OF THE COMPLEMENTARY ELEMENT(S)

In accordance with the present invention, in forming the ion compound with the selected dopant element, one or more complementary elements having high solid solubilities in the substrate with minimal or no detrimental electrical, chemical, or mechanical effects are selected.

Two such elements are silicon (Si) and germanium (Ge). Silicon has no solid solubility limit in a silicon substrate since they are the same material Germanium atoms integrate with the silicon structure and thus have unlimited solid solubility in a silicon substrate. Two other elements, tin (Sn) and lead (Pb), having high solubility in silicon, can also be used. Furthermore, it is within the methods of the present invention to control the atomic concentrations of the elements introduced into the substrate such that the concentration of each element is below the solid solubility of that element in the substrate.

To meet the three criteria, in one implementation, the source and drain p-type regions can be formed by using boron compounds containing elements identical to that of the substrate material. For example, for a silicon substrate, the shallow p-type regions are formed by using ion compound $Si_xB_y$ where x and y are the atomic ratios of the silicon atoms and the boron atoms in the ion compound. This ion compound meets the first criterion by using boron, a doping element with high solubility in silicon, meets the second criterion by using a boro compound to increase the mass of the ion, and meets the third criterion because silicon in silicon substrate has unlimited solubility.

In another implementation, the doped source and drain p-type regions can be formed by using germanium-boron compounds. For example, for a silicon substrate, the shallow p-type regions are formed by using ion compound $Ge_xB_y$ where x and y are the atomic ratios of the germanium atom(s) and the boron atom(s) in the ion compound. This ion compound meets the first criterion by using boron, a doping element with high solubility in silicon, meets the second criterion by using a boron compound to increase mass of the ion, and meets the third criterion because germanium atoms are readily soluble in the silicon substrate. This is because germanium atoms can form a continuous solid solution with silicon atoms. Furthermore, germanium has similar electrical, physical, and chemical properties as silicon. Because of the high solubility, no segregation of germanium occurs in subsequent processing steps. Thus, there is no migration of germanium atoms to the substrate surface when temperature of the substrate is elevated, and contacts or any thin films formed on the substrate surfaces are not detrimentally affected as the case with using $BF_2$ ions.

An alternate set of preferred ion compounds for doping a shallow p-type region are ternary boron compounds including atoms of the substrate material and an element that forms a solid solution with the substrate material, e.g. germanium. A ternary boron compound such as $Si_xGe_yB_z$ would be suitable for this application to form shallow p-type regions in a silicon substrate.

The present invention applies to the creation of n-type regions as well. For n-type regions, phosphorus (P) and arsenic (As) are the preferred dopant. In creating n-doped regions, ion compounds such as $Si_xP_y$, $Ge_xP_y$, $Si_xGe_yP_z$, or $Si_xAs_y$, $Ge_xAs_y$, $Si_xGe_yAs_z$ can be used.

With the above described method, the contacts to the substrate surfaces of the doped regions are securely bonded to the silicon surfaces without suffering from the segregation effect of the prior art, i.e. being separated by the migrating fluorine atoms. There is no migration problem with the present invention because there is no migration when implanted silicon and/or germanium atoms integrate with the substrate structure.

The present invention encompasses ion compound variations where the ion compound contains one or more elements that can be easily diffused from the substrate. One such element is hydrogen which has low solid solubility in a silicon or germanium substrate, but it can be used to associate with a dopant as part of the ion compound, e.g. $Si_xB_yH_z$. After implantation of such ion compound, the hydrogen atoms diffuse from the substrate, leaving silicon atoms and boron atoms in the substrate.

Although the above description is directed toward MOSFET devices, the present invention can easily be applied to bipolar junction transistors and all other semiconductor devices requiring shallowly doped regions.

IMPLANTATION METHODS

The present invention is not limited by implantation methods. It may use conventional implantation methods or it may use novel implantation methods.

Among the boron dopant compounds of $Si_xB_y$, several of these compounds, e.g. $SiB_2$, $SiB_4$, and $SiB_6$, are available commercially, where each compound is able to generate $Si_xB_y$ ion compounds in various atomic ratios. These compounds exist in solid powder form at room temperature under atmospheric pressure, and can be ionized and implanted in the silicon substrate to form a shallow p-type region by the following process.

A $Si_xB_y$ compound is placed in an inert high temperature cell equipped with a small orifice. When the cell is placed in a furnace with a vacuum pump connected thereto, the temperature is elevated by the heat from the furnace. Depending on the vapor pressure, the boron compound $Si_xB_y$ begins to evaporate at a certain temperature, and the evaporated compound is directed to effuse to form a collimated molecular beam. The beam is ionized, accelerated, and applied to an unmasked area in the silicon substrate. Shallow p-type regions are thus formed with boron dopant sources from the powder compounds.

Other reaction products ionized to generate ion compounds for implantation may be used as well. For example, compounds containing boron that may be used include $B_xH_y$, $(C_uH_vO_w)_xB_y$, compounds containing silicon that may be used include $Si_xH_y$, $Si_xC_yH_z$, $Si_xC_yH_yO_z$, $(C_mH_n)_xSi_y$ $(O_uC_vH_w)_z$, etc., and compounds containing germanium that may be used include $Ge_xB_y$, $Ge_xH_y$, $Ge_xC_yH_z$, $Ge_vC_xH_yO_z$, $(C_mH_n)_xGE_y(O_uC_vH_w)_z$, etc. Organosilicon compounds in various states solid, liquid, or gas) may also be used, including $Si_wC_xH_yB_z$, $Si_vC_wH_xO_yB_z$, $Si_wH_xN_yZ_z$, $Si_vC_wH_xN_yB_z$, etc., and organometallic compounds in various states (solid, liquid, or gas) may also be used, including $Ge_wB_xC_yH_z$, etc. Note that the subscripts refer to the number of the respective atom(s) in that compound. Generally speaking, a p-type ion compound is generated from a compound containing an element from Group IVa of the Periodic Table and one compound containing an element from Group IIIa of the Periodic Table, and an n-type ion compound is similarly generated from one compound containing an element from Group IVa of the Periodic Table and a compound containing an element from Group Va of the Periodic Table. For example, $Si_xB_y$ ion compounds can be generated from $SiH_4$ and $BH_3$ source compounds, and $Ge_xB_y$ ion compounds can be generated from $GeH_4$ and $BH_3$ source compounds.

In addition to the conventional method described above for generation of ion compounds, a physical sputtering method can also be used. Other ion formation and implantation methods, including plasma ion implantation, electron bombardment ionization, and other types of ion source/accelerator combinations, can be used to form and accelerate the ions necessary to accomplish the methods disclosed herein.

The present invention has an additional advantage in that it minimizes the channeling effect. When an ion compound is implanted into the substrate, separation of the dopant element and the complementary element(s) occurs and atoms of each element travel into the substrate to different projected ranges. Table 1 illustrates selected ion compounds, the elements in each of the compound, the implantation energy, the respective energy ratio in accordance to the mass of the compound, the corresponding energy for each atom, and the projected range of the atoms of that element in the substrate. For example, when a $Si_xB_y$ ion compound is implanted into a silicon substrate using 20 Kev, the projected range of silicon (246 Å), referring to table 1, is farther than the projected range of boron (236 Å). The physical effect of the longer projected range of silicon atoms is that the silicon atoms disrupt the crystalline structure when implanted and block the channels. The boron atoms thereby cannot travel through the channels of the crystalline structure as well. Similarly with implantation of boron-germanium compounds using 20 Kev, the projected range of germanium (190 Å) is farther than the projected range of boron (127 Å) and the channeling effect is similarly minimized. On the other hand, for boron-fluoride compounds implanted using 20 Kev, the projected range of fluoride (187 Å) is not farther than the projected range of boron (201 Å), and the channeling effect is only reduced to a certain extent.

TABLE 1

| Species Range | Element | Implant Energy | Energy Ratio | Projected Energy | |
|---|---|---|---|---|---|
| $BF_2$ | B | 20 | 11/49 | 4.48 | 201 |
|  | F |  | 19/49 | 7.75 | 187 |
| SiB | B | 20 | 11/39 | 5.64 | 236 |
|  | Si |  | 28/39 | 14.35 | 246 |
| GeB | B | 20 | 11/85 | 2.6 | 127 |
|  | Ge |  | 74/85 | 17.4 | 190 |

In summary, this invention teaches a method for manufacturing semiconductor devices with shallowly doped regions. The method includes the steps of: (a) providing a substrate where the material of the substrate is represented by the symbol Es; and (b) implanting the source/drain region with an ion compound represented by the symbol $E1_xEd_y$, where Ed represents an electron acceptor or donor, E1 represents an element with high solubility in the substrate material and can be the same element as that of the substrate material, and x and y are the respective atoms in the ion compound. In one implementation, the substrate is a silicon substrate, and the ion compound is $Si_xEd_y$. In another implementation, the substrate is a silicon substrate, and the combination dopant is $Ge_xEd_y$. In another embodiment where there is more than one complementary element, the substrate is a silicon substrate, the ion compound is $Si_xGe_yEd_z$ where x, y, and z indicate the ratio of the respective atoms in the ion compound. In all of these implementations, a p-type region is formed if Ed is selected from one of the p-type dopants, and a n-type region is formed if Ed is selected from one of the n-type dopants.

Although the discussion herein uses silicon substrates as examples, the present invention equally applies to germanium substrates, substrates of the III-V group (implanting GaAs substrates with ion compounds having corresponding dopant elements), and substrates of the II-VI group (implanting CdTe substrates with ion compounds having corresponding dopant elements).

This invention also discloses a method for implanting a compound into a substrate. The method includes the steps of (a) selecting the compound containing elements having high solid solubility in the selected substrate material; (b) energizing and ionizing the compound; and (c) introducing the ionized compound into the substrate to an atomic concentration for each of the elements that is below the solid solubility limit of the respective element in the substrate.

In another method for implantation, the present invention can be implemented by the method of plasma ion implantation for introducing a compound into a substrate. The method includes the steps of: (a) selecting one or more source materials containing elements for composing the ion compound where each element of the ion compound has high solid solubility; (b) introducing the selected source materials in a gaseous state into a plasma generating chamber for generating the desired ion compound in plasma form;

(c) ionizing and energizing the plasma compound; and (d) implanting the selected ion compound into the substrate to form a doped region where the atomic concentration level for each of the dopant element and the complementary elements in the substrate does not exceed the corresponding solid solubility limit of the respective element in the substrate material.

In addition to the ion compounds described above, a series of ion compounds including, but not limited to, compounds such as $Sn_xEd_y$, $Pb_xEd_y$, or in combination with silicon and/or germanium, can also be used to create the shallowly doped regions. The non-dopant element(s) in these compounds is(are) highly soluble in the silicon substrate.

The implantation methods described above are applicable to a wide range of devices. To those skilled in the art, these techniques can easily be applied to devices such as bipolar transistors, integrated injection logic, GaAs devices, i.e. the III-V semiconductors, silicon-on-insulator devices, etc. In addition to transistors, the present invention is also applicable to fabrication of diffused capacitors, resistors and other types of circuit components whenever shallowly doped regions are involved. More specifically, the present invention can be applied to p-well, n-well, or twin well implantation; threshold implantation to adjust a transistor's threshold voltage; poly implantation to define poly grain size and its sheet resistance, doping level and doping type; lightly doped drain (LDD) implantation to define the depth and concentration of LDD devices; junction implantation to define the depth and concentration of the source/drain junction regions; and implantation for PNP and NPN bipolar transistors.

Although the present invention has been described in terms of the presently preferred embodiment, it is to be understood that such disclosure is not to be interpreted as limiting. Various alterations and modifications will no doubt become apparent to those skilled in the art after reading the above disclosure. Accordingly, it is intended that the appended claims be interpreted as covering all alterations and modifications as fall within the true spirit and scope of the invention.

What we claim is:

1. A method for creating a doped region in a semiconductor device where the semiconductor is formed on a substrate of a selected material, comprising the steps of:
   a) providing a substrate of a selected material;
   b) selecting an ion compound including one or more atoms of a dopant element and one or more atoms of one or more complementary elements, the dopant element and the complementary elements each having a solid solubility limit in the material of the substrate, where in the one or more complementary elements are one ore more different elements selected from the group of elements consisting of silicon, germanium, tin, and lead; and
   c) implanting the selected ion compound into the substrate to form a doped region where the atomic concentration level for each of the dopant element and the complementary elements in the substrate does not exceed the corresponding solid solubility limit of the respective element in the substrate material.

2. A method as recited in claim 1 wherein said substrate material is composed of an element selected from the group of elements consisting of silicon, and germanium.

3. A method as recited in claim 1 wherein said substrate material is diamond.

4. A method as recited in claim 1 wherein said dopant element is a p-type dopant element.

5. A method as recited in claim 4 wherein said p-type dopant element is an element selected from the group of elements consisting of boron, aluminum, gallium, and indium.

6. A method as recited in claim 1 wherein said dopant element is an n-type dopant element.

7. A method as recited in claim 6 wherein said n-type dopant element is an element selected from the group of elements consisting of nitrogen, phosphorus, antimony, and arsenic.

8. A method as recited in claim 1 wherein the ion compound further includes one or more atoms of hydrogen.

9. A method as recited in claim 3 wherein said dopant element is a p-type dopant element.

10. A method as recited in claim 9 wherein said p-type dopant element is an element selected from the group of elements consisting of boron, aluminum, gallium, and indium.

11. A method as recited in claim 10 wherein said dopant element is an n-type dopant element.

12. A method as recited in claim 11 wherein said n-type dopant element is an element selected from the group of elements consisting of nitrogen, phosphorus, antimony, and arsenic.

13. A method as recited in claim 12 wherein the ion compound further includes one or more atoms of hydrogen.

14. A method as recited in claim 1 wherein the method is applied to form p-well, n-well, and twin-well on the substrate.

15. A method as recited in claim 1 wherein the method is applied to adjust threshold voltage of the semiconductor.

16. A method as recited in claim 1 wherein the method is applied to poly implantation to define poly grain size, sheet resistance, doping level and doping type.

17. A method as recited in claim 1 wherein the method is applied to form lightly doped drain devices.

18. A plasma ion implantation method for creating a doped region in a semiconductor device where the semiconductor is formed on a substrate of a selected material, comprising the steps of:
   a) providing a substrate of a selected material;
   b) selecting one or more source materials for composing an ion compound including one or more atoms of a dopant element and one or more atoms of one or more complementary elements, the dopant element and the complementary elements each having a solid solubility limit in said substrate material, where in the one or more complementary elements are one or more different elements selected from the group of elements consisting of silicone, germanium, tin, and lead;
   c) introducing the selected source materials in a gaseous state into a plasma generating chamber to create the ion compound;
   d) ionizing the ion compound;
   e) implanting the ion compound into the substrate to form a doped region, where the atomic concentration level for each of the dopant element and the complementary elements in the substrate does not exceed the corresponding solid solubility limit of the respective element in the substrate material.

19. A method as recited in claim 18 wherein said substrate material is composed of an element selected from the group of elements consisting of silicon, and germanium.

20. A method as recited in claim 18 wherein said substrate material is diamond.

21. A method as recited in claim 18 wherein said dopant element is a p-type dopant element.

22. A method as recited in claim 21 wherein said p-type dopant element is an element selected from the group of elements consisting of boron, aluminum, gallium, and indium.

23. A method as recited in claim 18 wherein said dopant element is an n-type dopant element.

24. A method as recited in claim 23 wherein said n-type dopant element is an element selected from the group of elements consisting of nitrogen, phosphorus, antimony, and arsenic.

25. A method as recited in claim 18 wherein the ion compound further includes one or more atoms of hydrogen.

26. A method as recited in claim 18 wherein the source materials are one or more materials selected from the group of compounds consisting of $SiB_2$, $SiB_4$, $SiB_6$, $B_xH_y$, $(C_uH_vO_w)_xB_y$, $Si_xH_y$, $Si_xC_yH_z$, $Si_vC_xH_yO_z$, $(C_mH_n)_xSi_y(O_uC_vH_w)_z$, $Si_wC_xH_yB_z$, $Si_vC_wH_xO_yB_z$, $Si_wH_xN_yB_z$, $Si_vC_wH_xN_yB_z$, $Ge_wB_xC_yH_z$, $Ge_xB_y$, $Ge_xH_y$, $Ge_xC_yH_z$, $Ge_vC_xH_yO_z$, and $(C_mH_n)_xGe_y(O_uC_vH_w)_z$.

27. A method as recited in claim 26 wherein said dopant element is a p-type dopant element.

28. A method as recited in claim 27 wherein said p-type dopant element is an element selected from the group of elements consisting of boron, aluminum, gallium, and indium.

29. A method as recited in claim 28 wherein said dopant element is an n-type dopant element.

30. A method as recited in claim 29 wherein said n-type dopant element is an element selected from the group of elements consisting of nitrogen, phosphorus, antimony, and arsenic.

31. A method as recited in claim 30 wherein the ion compound further includes one or more atoms of hydrogen.

32. A method as recited in claim 31 wherein the source materials are one or more materials selected from the group of compounds consisting of $SiB_2$, $SiB_4$, $SiB_6$, $B_xH_y$, $(C_uH_vO_w)_xB_y$, $Si_xH_y$, $Si_xC_yH_z$, $Si_vC_xH_yO_z$, $(C_mH_n)_xSi_y(O_uC_vH_w)_z$, $Si_wC_xH_yB_z$, $Si_vC_wH_xO_yB_z$, $Si_wH_xN_yB_z$, $Si_vC_wH_xN_yB_z$, $Ge_wB_xC_yH_z$, $Ge_xB_y$, $Ge_xH_y$, $Ge_xC_yH_z$, $Ge_vC_xH_yO_z$, and $(C_mH_n)_xGe_y(O_uC_vH_w)_z$.

33. A method as recited in claim 18 wherein the source materials are $BH_3$ and $SiH_4$.

34. A method as recited in claim 18 wherein the source materials are $BH_3$ and $GeH_4$.

35. A method as recited in claim 18 wherein the method is applied to form p-well, n-well, and twin-well on the substrate.

36. A method as recited in claim 18 wherein the method is applied to adjust threshold voltage of the semiconductor.

37. A method as recited in claim 18 wherein the method is applied to poly implantation to define poly grain size, sheet resistance, doping level and doping type.

38. A method as recited in claim 18 wherein the method is applied to form lightly doped drain devices.

* * * * *

UNITED STATES PATENT AND TRADEMARK OFFICE
CERTIFICATE OF CORRECTION

PATENT NO. : 5,763,319

DATED : June 9, 1998

INVENTOR(S) : Ling et al

It is certified that error appears in the above-identified patent and that said Letters Patent is hereby corrected as shown below:

On the Title Page

[73] Assignee: Reads "Advanced Materials Engineering" should read --Advanced Materials Engineering Research, Inc.--

[63] Continuation-in-part of Ser. No. 514,757, delete "Aug. 15, 1996" and insert therefor --Aug. 14, 1996--

Column 1, line 12, delete "Aug. 15, 1996" and insert therefor --Aug. 14, 1996--

Column 2, line 3, delete "z" and insert therefor --Z--.

Column 4, line 58, delete "VA" and insert therefor --IVA--

Column 5, line 53, "after same material" insert --.--

Column 6, line 4, delete "boro" and insert therefor --boron--

Column 7, line 26, insert --(-- before the word "solid"

UNITED STATES PATENT AND TRADEMARK OFFICE
CERTIFICATE OF CORRECTION

PATENT NO.  : 5,763,319

DATED       : June 9, 1998

INVENTOR(S) : Ling et al

It is certified that error appears in the above-identified patent and that said Letters Patent is hereby corrected as shown below:

Column 8, the heading of Table 1 should read as follows:

| Species | Element | Implant Energy | Energy Ratio | Energy | Projected Range |
|---------|---------|----------------|--------------|--------|-----------------|

Column 9, line 51, delete "where in" and insert therefor --wherein--.

Column 10, line 47, delete "where in" and insert therefor --wherein--.

Signed and Sealed this

Fifteenth Day of May, 2001

Attest:

NICHOLAS P. GODICI

Attesting Officer

Acting Director of the United States Patent and Trademark Office